US005466884A

United States Patent [19]

Van Duyne et al.

[11] Patent Number: 5,466,884

[45] Date of Patent: Nov. 14, 1995

[54] MUSIC SYNTHESIZER SYSTEM AND METHOD FOR SIMULATING RESPONSE OF RESONANT DIGITAL WAVEGUIDE STRUCK BY FELT COVERED HAMMER

[75] Inventors: Scott A. Van Duyne, Stanford; Julius O. Smith, III, Palo Alto, both of Calif.

[73] Assignee: The Board of Trustees of the Leland Stanford Junior University, Stanford, Calif.

[21] Appl. No.: 240,866

[22] Filed: May 10, 1994

[51] Int. Cl.[6] .............................. G10H 5/00; G10H 1/12; H03H 7/01

[52] U.S. Cl. .................................. 84/661; 84/622; 84/659

[58] Field of Search .............................. 84/600, 622, 626, 84/630, 659–661

[56] References Cited

U.S. PATENT DOCUMENTS

| | | | |
|---|---|---|---|
| 4,984,276 | 1/1991 | Smith | 84/630 X |
| 5,187,314 | 2/1993 | Kunimoto et al. | 84/626 |
| 5,229,536 | 7/1993 | Kunimoto | 84/658 |
| 5,241,127 | 8/1993 | Kobayashi | 84/616 |
| 5,256,830 | 10/1993 | Takeuchi et al. | 84/630 X |
| 5,266,734 | 11/1993 | Komano et al. | 84/DIG. 9 X |
| 5,286,915 | 2/1994 | Komano et al. | 84/658 |
| 5,290,969 | 3/1994 | Kobayashi | 84/622 |
| 5,304,734 | 4/1994 | Kunimoto | 84/661 |

OTHER PUBLICATIONS

"Model analysis of a hammer–string interaction"; H. Suzuki; J. Acoust. Soc. Am 82(4); Oct. 1987; pp. 1145–1151.

"Model for piano hammers: Experimential determination and digital simulation;" X. Boutillon; J. Acoust.Soc. Am 83(2); Feb. 1988; pp. 746–754.

"Numerical simulations of piano strings. I. A physical model for a struck string using finite difference metods", A. Chaigne et al.; J. Acoust. Soc. Am 95 (2); Feb. 1994; pp. 1112–1118.

"Numerical simulations of pinao strings. II. Comparisons with measurements and systematic exploration of some hammer–string parameters"; A. Chaigne et al.; J.Acoust.Soc.Am 95(3); Mar. 1994; pp. 1631–1640.

*Primary Examiner*—William M. Shoop, Jr.
*Assistant Examiner*—Jeffrey W. Donels
*Attorney, Agent, or Firm*—Flehr, Hohbach, Test, Albritton & Herbert

[57] ABSTRACT

A musical sound synthesizer simulates interaction of a hammer having a compressible striking surface with a resonating medium. A digital waveguide resonator that simulates operation of a resonating medium and generates digital resonator waveforms representing signals propagating in said digital waveguide resonator. A hammer filter simulates the hammer striking the resonating medium and generates first and second hammer waveforms. The hammer filter includes a scattering junction that couples the hammer filter to the digital waveguide resonator. The hammer filter also includes a compression function that generates from the first and second hammer waveforms a compression value corresponding to compression of said simulated hammer, a stiffness function that generates a time varying stiffness coefficient as a function of the compression value, a excitation signal function that generates a hammer excitation signal as a function of hammer strike impulses, and a hammer function that generates the first hammer waveform as a function of the compression value, the hammer excitation signal and the second hammer waveform. The scattering junction transmits the digital resonator waveforms received from the digital waveguide resonator unchanged back into the digital waveguide resonator when the compression value corresponds to the hammer not being compressed and otherwise transmits a first time varying portion of the first digital resonator waveform combined with a second time varying portion of the digital resonator waveforms, wherein the first and second time varying portions of the first digital waveguide waveform and the digital resonator waveforms, respectively, are functions of the compression value.

8 Claims, 5 Drawing Sheets

MUSIC SYNTHESIZER SYSTEM AND METHOD FOR SIMULATING RESPONSE OF RESONANT DIGITAL WAVEGUIDE STRUCK BY FELT COVERED HAMMER

The present invention relates generally to musical sound synthesis using networks of digital waveguides, and particularly to a digital filter that can be coupled to a resonant digital waveguide network for simulating interaction of a felt covered hammer with a one-dimensional string, two-dimensional membrane or three-dimensional musical resonator.

BACKGROUND OF THE INVENTION

The use of digital waveguide networks for digital signal processing and musical synthesis is disclosed in U.S. Pat. No. 4,984,276, which teaches the use of digital processors having digital waveguide networks for digital reverberation and for synthesis of musical sounds such as those associated with reed and string instruments. U.S. Pat. No. 4,984,276 is hereby incorporated by reference. The present invention concerns a digital waveguide hammer filter, which is a time varying digital filter that models a piano hammer or felt mallet.

The digital waveguide hammer filter of the present invention was designed to be used in conjunction with a one-dimensional digital waveguide network modeling a string (e.g., a piano string) to produce physically correct hammer-string interactions, and to be used in conjunction with a two-dimensional digital waveguide network modeling a membrane (such as a drum's surface) to produce physically correct mallet-membrane interactions. The digital waveguide hammer filter, however, can be used in conjunction with virtually any digital waveguide network, regardless of what the digital waveguide network is being used to model.

While the interactions of felt covered hammers with piano strings and the like has been the subject of study for some time, most such work has modeled strings and piano hammers in a manner that did not lend itself to real time musical synthesis with the microprocessors and digital signal processors typically found in music synthesizers and desktop computers in 1994 (i.e., microprocessors and digital signal processors capable of 33 million to approximately 100 million 32-bit mathematical computations per second).

Digital signal waveguides provide a methodology for simulating the operation of acoustic musical instruments and other resonators in a very computationally efficient manner, allowing real time computation of acoustic frequency waveforms in a resonating system with fairly modest computational resources. Recently issued patents using digital signal waveguides to synthesize musical tones in a manner that relates to the striking of a string by a hammer includes U.S. Pat. Nos. 5,187,314 (Kunimoto), 5,229,536 (Kunimoto) and 5,241,127 (Kobayashi), all of which are assigned to Yamaha Corporation of Hamamatsu, Japan.

SUMMARY OF THE INVENTION

The present invention is a music synthesizer having a main resonator waveguide network (e.g., a loop or mesh) that is coupled to a digital waveguide hammer filter by a scattering junction. The digital waveguide hammer filter uses a digital waveguide model of a felt covered hammer or mallet that enables efficient computation of the interactions between a string or membrane an a hammer that strikes the string or membrane. The digital waveguide hammer filter models the variable stiffness of the hammer's felt, which varies in accordance with compression of the felt, and models the mutual interaction of the string and hammer so as to generate a hammer waveform that is injected in attenuated form into the main resonator as an excitation signal.

The digital waveguide hammer filter of the present invention includes a time varying scattering junction that passes waveforms from the resonator waveguide network into the digital waveguide hammer filter. The digital waveguide hammer filter also includes an digital oscillator loop for generating a hammer velocity waveform whose oscillation frequency is a function of the compression of a simulated felt covered hammer by interaction of a simulated hammer with the waveforms received from the resonator. The digital waveguide hammer filter acts as a pass through filter that does not affect the waveforms in the resonator when the simulated hammer is not in contact with the string/membrane of the main resonator. When the simulated hammer is in contact with the string/membrane, the hammer filter modulates the frequency of its oscillator, by introducing a phase delay in its oscillator loop, in accordance with the time varying spring constant of the compressed felt.

Furthermore the hammer filter generates a time varying non-zero hammer wave impedance value when the simulated hammer is compressed. The time varying hammer wave impedance value is a function of the time varying compression of the hammer felt such that the hammer wave impedance increases in a nonlinear manner with increasing compression of the hammer felt. The waveform generated in the digital oscillator loop of the hammer filter is coupled to the main resonator in accordance with the wave impedance values of the resonator and hammer filter.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
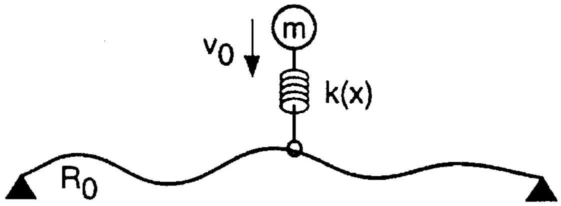
FIG. 1 depicts a string coupled mid-span to a mass by a spring.

Referring to FIG. 1, there is shown the fundamental physical model of a string loaded by a nonlinear mass/spring system. The digital waveguide hammer filter of the present invention treats the hammer felt of a hammer striking a piano string as a spring that is loaded with the mass of a hammer. In FIG. 1 the parameter $R_0$ represents the string's wave impedance, which is related to the density and stiffness of the string.

Figure 2:
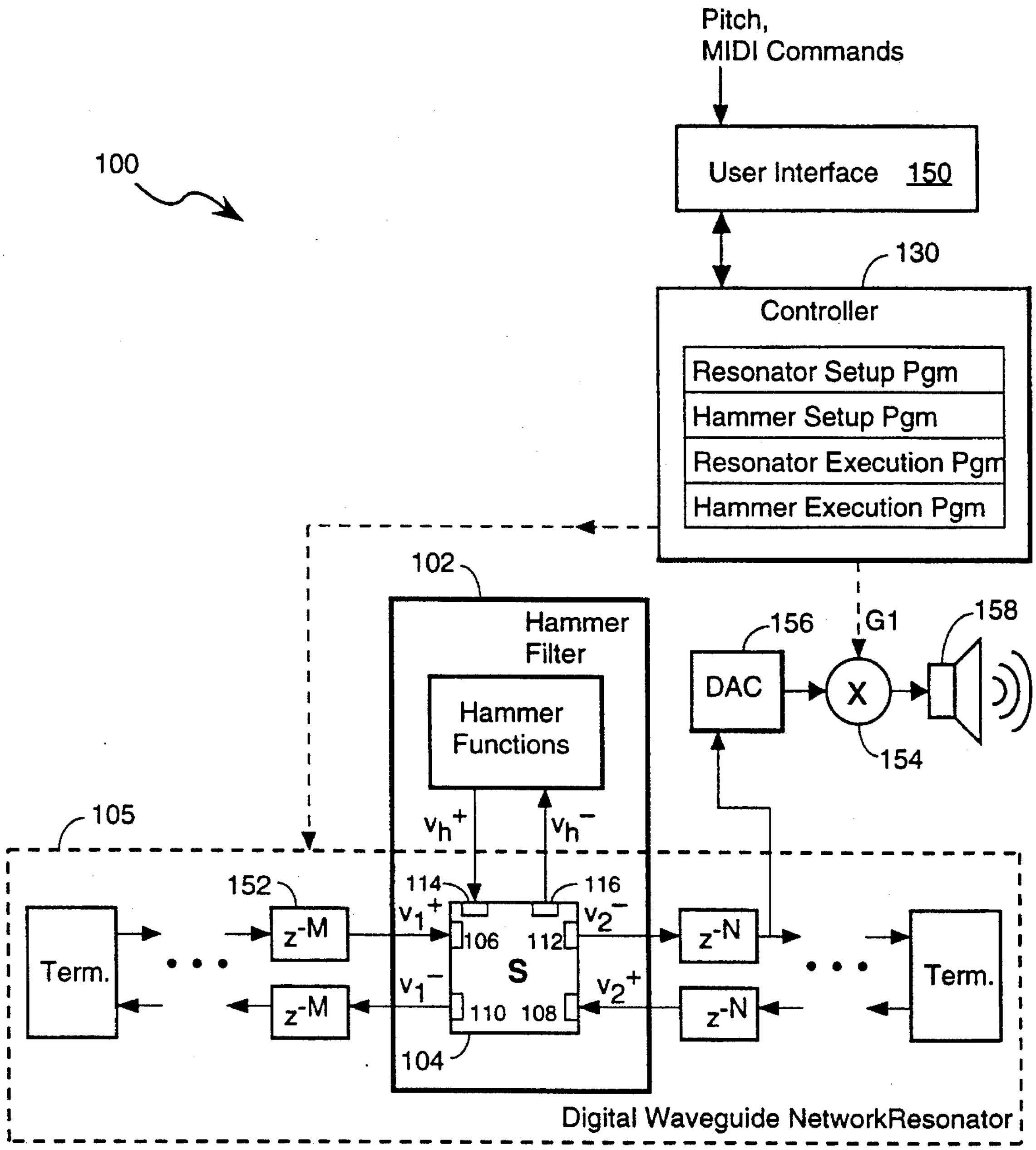
FIG. 2 is a block diagram of a music synthesizer having a one dimensional digital waveguide resonator network and a digital waveguide hammer filter in accordance with the present invention.

Referring to FIG. 2, there is shown a music synthesizer 100 in which a digital waveguide hammer filter 102 is coupled by a time-varying scattering junction 104 (S) to a digital waveguide resonator 105. The hammer filter 102 simulates a felt covered hammer or mallet as a pair of velocity waves in a medium having a variable wave impedance denoted as $R_h$.

In the preferred embodiment, all signals or waveforms in the synthesizer are updated at a rate of 44,100 samples per second. For simplicity, in the equations in this document, time is represented by a variable n which starts at a value of zero at is incremented by one each sample period. Thus, after one second n will have a value of 44,100. Since the sampling rate of the preferred embodiment is 44,100 samples per second, the output signal generated by the synthesizer can have frequency components up to approximately 22 kHz.

The term "hammer" is defined for the purposes of this document to mean any instrument used to strike a resonating medium whose striking surface is at least somewhat compressible during normal use, and the term "hammer felt" is defined to mean the compressible portion of a hammer's striking surface.

The term "simulated hammer" is defined for the purposes of this document to mean any hammer-like instrument simulated by a digital waveguide hammer filter in accordance with the present invention, without regard to whether or not any such physical instrument exists. The present invention can simulate the operation of hammer-like instruments that might not be possible to implement with physical components.

The term "resonating medium" is defined for the purposes of this document to mean any resonating or reverberating system, whether real or not, simulated by a digital waveguide network. Digital waveguide networks can simulate the operation of instruments that might not be possible to implement with physical components.

Time Varying Scattering Junction

Figure 3:
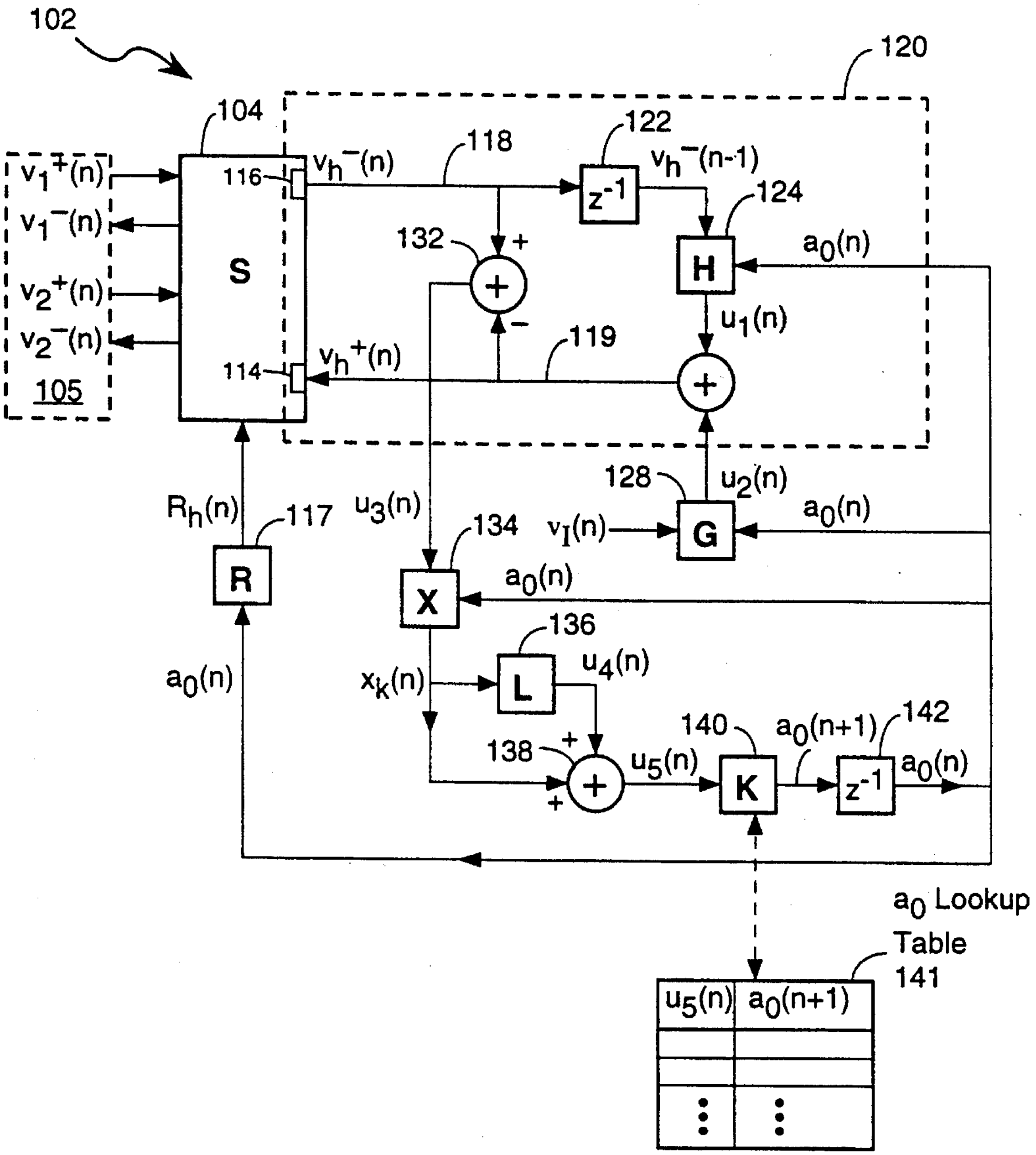
FIG. 3 depicts a digital waveguide hammer filter in accordance with the preferred embodiment of the present invention.

Referring to FIGS. 2 and 3, the scattering junction 104 (S) utilizes the time-varying wave impedance $R_h$ of the simulated hammer to couple the simulated hammer to the resonator 105. The scattering junction 104 (S) receives velocity waveforms $v_1^+(n)$ and $v_2^+(n)$ from the digital waveguide resonator 105 on ports 106 and 108, respectively, of the scattering junction. The scattering junction 104 (S) outputs velocity waveforms $v_1^-(n)$ and $v_2^-(n)$ to the digital waveguide resonator 105 via ports 110 and 112, respectively, of the scattering junction 104. In addition, the scattering junction receives a first hammer velocity waveform $v_h^+(n)$ from the digital waveguide hammer filter 102 on port 114 of the scattering junction and outputs a second hammer velocity waveform $v_h^-(n)$ to the digital waveguide hammer filter 102 via port 116 of the scattering junction.

The operation of the scattering junction 104 is defined as follows:

$$\begin{cases} v_1^-(n) = v_j(n) - v_1^+(n) \\ v_2^-(n) = v_j(n) - v_2^+(n) \\ v_3^-(n) = v_j(n) - v_3^+(n) \end{cases} \quad (1)$$

where and where the hammer velocity wave impedance function 117 (R) generates $$v_j(n) = \frac{2R_0[v_1^+(n) + v_2^+(n)] + 2R_h(n)v_h^+(n)}{2R_0 + R_h(n)} \quad (2)$$

a current hammer velocity wave impedance value $R_h$ for time period n as follows:

$$R_h(n) = \frac{(m\alpha)(1 + a_0(n))}{2} \quad (3)$$

In the above equations, $R_0$ represents the wave impedance of the resonant system, $R_h(n)$ represents the effective time varying wave impedance of the digital waveguide hammer filter 102, m represents the mass of the simulated hammer, and α is an arbitrary constant that is preferably set equal to twice the sampling rate of the synthesizer.

The variable $a_0(n)$ in equation 3, above, and in the equations shown below represents a felt stiffness coefficient, where a felt stiffness value of −1 represents zero stiffness (when the hammer felt is not being compressed by the hammer) and a felt stiffness value of +1 represents infinite stiffness.

When the hammer simulated by the hammer filter 102 is not in contact with the simulated resonating medium, as represented by the waveforms received from the resonator 105, the felt stiffness coefficient $a_0(n)$ is equal to −1 and the hammer filter's wave impedance $R_h(n)$ is equal to zero (see equation 3 ). As a result, as can be seen from equations 1 and 2, when the simulated hammer is not in contact with the resonating medium the waveforms $v_1^-(n)$ and $v_2^-(n)$ in the main resonator 105 are not affected by the hammer velocity waveform, represented by $v_h^-(n)$ and $v_h^+(n)$, whatsoever.

However, when the hammer simulated by the hammer filter is in contact with the resonating medium, the felt stiffness coefficient $a_0(n)$ is equal to a value, typically ranging between −0.9999 and −0.98, corresponding to the amount of compression of the hammer's felt, and the hammer filter's wave impedance $R_h(n)$ is then equal to a non-zero value. In that case, as can be seen from equations 1 and 2, the waveforms $v_1^-(n)$ and $v_2^-(n)$ in the main resonator are coupled to the hammer velocity waveform, represented by $V_h^+(n)$, by an impedance of $R_h(n)$ on the digital hammer filter side and by an impedance of $R_0$ on the resonator side of the junction. The amount of scattering of the hammer velocity waveform $V_h^+(n)$ into the resonator 105 will be proportional to:

$$\frac{2R_h(n)}{2R_0(n) + R_h(n)} . \quad (4)$$

From another viewpoint, the scattering junction can be viewed as having a junction velocity equal to $v_j(n)$, as defined by equation 2, above. The junction velocity $v_j(n)$ is formed by combining time varying fractions of the resonator waveforms $v_1^+(n)$ and $v_2^+(n)$ and the hammer filter waveform $V_h^+(n)$. The contribution of the hammer filter waveform $V_h^+(n)$ to the junction velocity $v_j(n)$ is proportional to the ratio defined by equation 4. The junction velocity is added equally to each of the waveforms $v_1^-(n)$ and $v_2^-(n)$ that are output by the scattering junction 104 (S) into the resonator 105.

Hammer Functions

Referring to FIG. 3, a closed loop oscillator 120 is formed by the scattering junction 104 (S), hammer velocity waveform nodes 118 and 119, a unit time delay element 122, and a nonlinear allpass filter 124. Unlike the oscillator formed by the main resonator 105, the hammer filter's loop oscillator 120 has a characteristic oscillation frequency of zero when the simulated hammer is applying no force to the medium represented by the resonator 105. The hammer filter oscillator loop 120 models a mass/spring system with a variable "spring constant" in which the nonlinear allpass filter 124 (H) sets the spring constant in accordance with the simulated hammer's felt compression, and thereby controls the hammer filter loop's oscillation frequency. Equivalently, the nonlinear allpass filter 124 (H) can be viewed as introducing a variable phase delay into the hammer filter's oscillator loop 120 that controls the oscillation frequency of the hammer filter's oscillator loop 120.

In particular, the transfer function of the nonlinear allpass filter 124 (H) is:

$$u_1(n)=a_0(n)[v_h^-(n-1)-u_1(n-1)]+v_h^-(n-2) \quad (5)$$

Since the felt stiffness coefficient $a_0(n)$ is almost always very close −1 in value equation 5 can be rewritten in more intuitive form as follows:

$$u_1(n)=-a_0(n)u_1(n-1)-[-a_0v_h^-(n-1)-v_h^-(n-2)] \quad (6)$$

From equation 6 it can be seen that the output $u_1(n)$ of the nonlinear allpass filter 124 (H) is equal to (A) the filter's output in the prior time period $u_1(n)$ attenuated by a factor of $-a_0(n)$, minus (B) the change in received hammer velocity wave $v_h^-(n)$ between times n−2 and n−1 where the more recent sample of the received hammer velocity wave $v_h^-(n-1)$ is attenuated by a factor of $-a_0(n)$. The affect of the attenuation factor $-a_0(n)$, when it is unequal to −1, is to "increase the spring constant" of the mass/spring system modeled by the hammer filter's oscillator loop 120 and to thereby increase the loop's oscillation frequency.

The velocity waveform of the simulated hammer is a function of any hammer strike impulses specified by the user and is also a function of the time-varying felt stiffness coefficient $a_0(n)$. The reason that the simulated hammer's velocity waveform is a function of the felt stiffness coefficient $a_0(n)$ is that the felt stiffness represents the instantaneous spring-constant of the hammer's felt. As explained in more detail below, the felt's sprint constant increases in a nonlinear fashion with increased compression of hammer's felt. Furthermore, the product of the felt stiffness constant k and the current hammer position represents the amount of back force on the simulated hammer. As a result, the portion of the hammer velocity waveform associated with hammer strikes is computed using a modified one-pole integrator 128 (G) defined by:

$$u_2(n)=\frac{v_I(n)+2v_I(n-1)+v_I(n-2)}{2\alpha}-a_0(n)u_2(n-1) \quad (7)$$

$V_I(n)$ is a hammer velocity input function that has the form of an impulse function representing the hammer's initial velocity:

$$v_I(n)=\frac{v_0\delta(n)}{T},\ \delta(n)=\begin{cases}1, & n-0\\ 0, & n\neq 0\end{cases} \quad (8)$$

where v0 is a negative quantity, indicating movement in the negative direction (toward the string/membrane simulated by the main resonator). While the impulse hammer blow is defined by equation 8 to occur at time n=0, the synthesizer's controller 130 (see FIG. 2) can specify the hammer velocity input function $v_I(n)$ to have a hammer impulses at any specified time, or to have a series of hammer impulses at a set of specified times:

$$v_I(n)=\frac{v_0\delta(n)}{T},\ \delta(n)=\begin{cases}1, & n-\text{specified times}\\ 0, & n\neq\text{all other times}\end{cases} \quad (9)$$

The hammer velocity $u_2(n)$ is an excitation signal that is added to the output $u_1(n)$ of the nonlinear allpass filter 124 (H) to generate the hammer velocity waveform $v_h^+(n)$ on node 119. When multiple hammer strikes are used, it is preferable that each hammer strike take place only after the filter coefficient $a_0(n)$ has returned to a value of −1, and thus $R_h(n)$ equals zero. Furthermore, the following variables in the filter should be initialized to a value of zero at the time of each hammer strike: $v_h^-(n)$, $v_h^-(n-1)$, $v_h^-(n-2)$, $u_1(n)$, $u_1(n-1)$, $u_2(n)$, and $u_2(n-1)$.

Hammer Felt Compression Functions

Adder 132 computes the difference $u_3(n)$ between the two hammer velocity waveforms:

$$u_3(n)=v_h^-(n)-v_h^+(n) \quad (10)$$

where $u_3(n)$ represents the amount of force applied to the resonator medium by the simulated hammer's felt, scaled by $1/R_h(n)$.

A felt compression function 134 (X) translates the force signal $u_3(n)$ into a felt compression value $x_k(n)$:

$$x_k(n)=\frac{u_3(n)(a_0(n)-1)}{2\alpha} \quad (11)$$

$x_k(n)$ has a negative value when the simulated hammer felt is being compressed. When $x_k(n)$ is greater than or equal to zero, the simulated hammer felt is not being compressed.

A felt loss hysteresis function 136 (L) generates a hysteresis loss factor $u_4(n)$ as follows:

$$u_4(n)=\begin{cases}0, & x_k(n)\leqq 0\\ \epsilon(x_k(n))[x_k(n)-x_k(n-1)], & x_k(n)<0\end{cases} \quad (12)$$

where $\epsilon$ is a typically a small positive valued constant or table, preferably derived from felt stiffness and loss functions measured from an actual felt covered hammer or mallet.

Adder 138 adds the hysteresis loss factor $u_4(n)$ generated by the hysteresis function 136 (L) from the felt compression value $x_k(n)$ to generate an adjusted felt compression value $u_5(n)$:

$$u_5(n)=x_k(n)+u_4(n) \quad (13)$$

During the downward stroke of the simulated hammer, while $x_k(n)$ is becoming more negative, the hammer's felt becomes more compressed. In accordance with equation 12 above, $u_4(n)$ will be a negative value during the downward stroke of the simulated hammer, and thus $u_5(n)$ will be smaller (i.e., more negative) than $x_k(n)$ while the hammer felt's compression is increasing. Smaller (i.e., more negative) values of $u_5(n)$ correspond to greater stiffness and thus to larger spring constant values.

When the felt expands, pushing back on the simulated hammer, the simulated hammer is in its upstroke and $u_4(n)$ will be a positive value in accordance with equation 12, and thus $u_5(n)$ will be larger (i.e., less negative) than $x_k(n)$ while the hammer felt's compression is decreasing.

The felt stiffness function 140 (K) generates the felt stiffness coefficient $a_0(n)$ as follows:

$$a_0(n+1) = \begin{cases} -1, & u_5(n) \leqq 0 \\ \dfrac{k(u_5(n)) - m\alpha^2}{k(u_5(n)) + m\alpha^2}, & u_5(n) < 0 \end{cases} \tag{14}$$

where $k(u_5)$ is a nonlinear function. In one preferred embodiment, the felt stiffness function 140 uses a spring constant lookup table, and interpolation for $u_5$ values between data points in the table, to compute the value of $k(u_5)$ and then computes the value of $a_0(n+1)$ in accordance with the equation shown above. In another more computationally efficient preferred embodiment, the felt stiffness function 140 uses a felt stiffness coefficient lookup table 141, and interpolation for $u_5$ values between data points in the table, to compute the value of $a_0(n+1)$.

Figure 4:
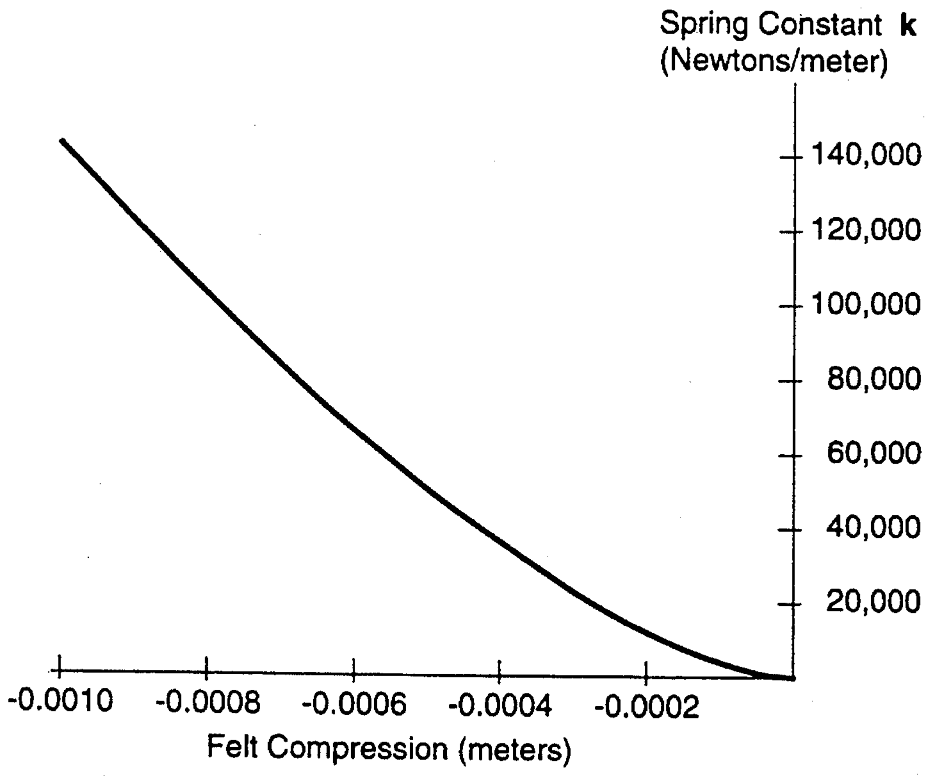
FIG. 4 is a graph of an example of the nonlinear spring constant function for a felt covered hammer.

FIG. 4 is a graph of an the nonlinear spring constant function $k(u_5)$ for one example of a felt covered hammer. The spring constant function shown in FIG. 4 is representative of the spring constant function of a hammer for the middle-C string of a piano. In this example, the hammer's felt is typically never compressed by more than a millimeter, and the stiffness of the felt (i.e., its spring constant) increases from 0 to approximately 140,000 Newtons per meter as the hammer felt's compression changes from zero to 0.001 meters.

Figure 5:
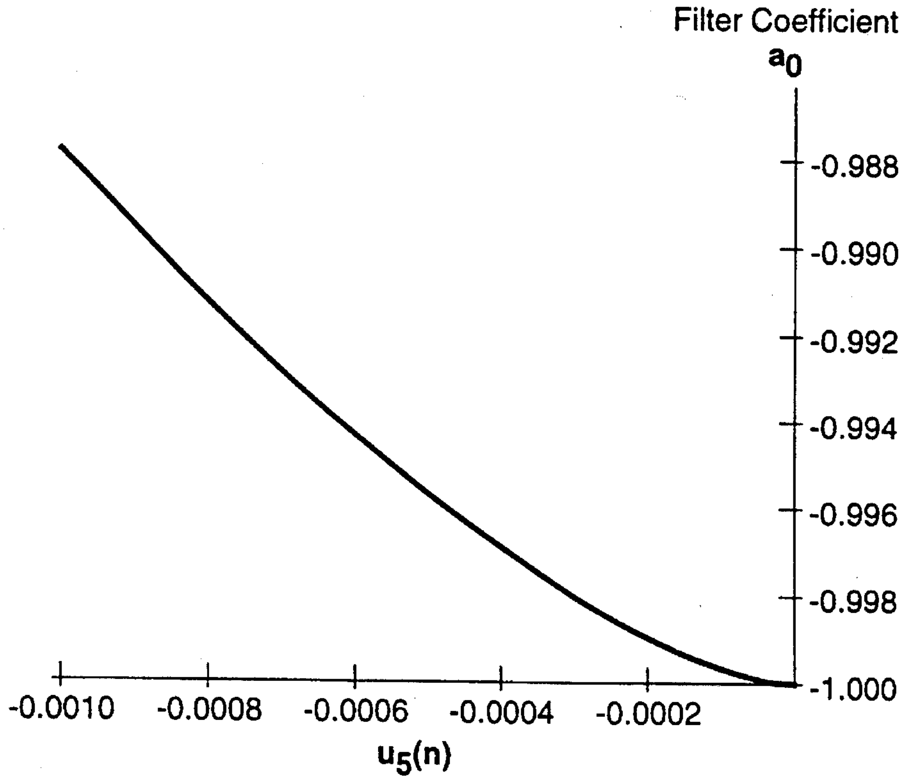
FIG. 5 is a graph of the relationship between felt compression and the filter coefficient $a_0(n)$ for a hammer having the spring constant function shown in FIG. 4.

FIG. 5 depicts the relationship between felt compression and the filter coefficient $a_0(n)$ for a digital hammer filter in accordance with the present invention having the spring constant function shown in FIG. 4. The filter coefficient $a_0(n)$ for a digital hammer filter that is modeled on actual piano hammers will typically range between −1.0 and approximately −0.98.

Figure 6:
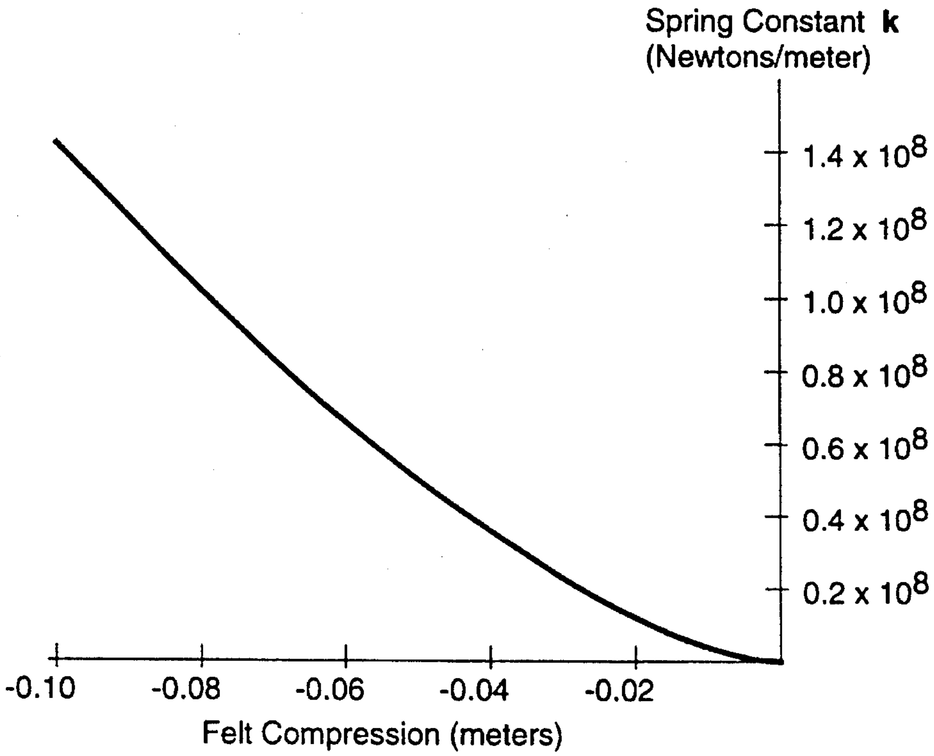
FIG. 6 is a graph of the nonlinear spring constant function for compression up to 0.1 meters (10 cm) of a hypothetical hammer.
Figure 7:
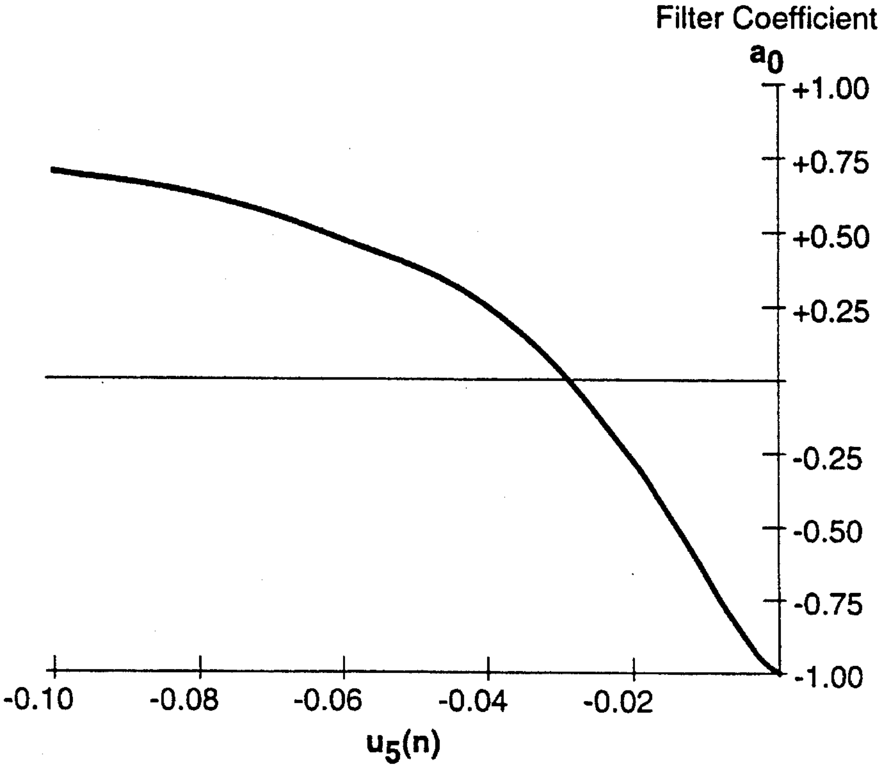
FIG. 7 is a graph of the relationship between felt compression and the filter coefficient $a_0(n)$ for a hammer having the spring constant function shown in FIG. 6.

As shown in FIGS. 6 and 7, it is quite possible to use the digital hammer filter of the present invention to model hammers that do not correspond to any hammers or mallets used in existing acoustic instruments. FIG. 6 depicts the nonlinear spring constant function for compression up to 0.1 meters (10 cm) of a hypothetical hammer, and FIG. 7 is a graph of the relationship between felt compression and the filter coefficient $a_0(n)$ for a hammer having the spring constant function shown in FIG. 6. As shown in FIG. 7, the filter coefficient $a_0(n)$ for a digital hammer filter may vary over a larger range than that shown in FIG. 5. However, the felt stiffness coefficient $a_0(n)$ for a digital hammer filter is cannot go outside the range −1 (no stiffness) to +1 (infinite stiffness), because outside that range the digital hammer filter becomes unstable.

The net effect of the hysteresis function 136 (L) described above is to increase the spring constant k of the hammer, and thus to increase the value of the filter coefficient $a_0(n+1)$ (typically by making $a_0(n+1)$ less negative in value) during the downward stroke of the simulated hammer. During the upward stroke of the simulated hammer, the net effect of the hysteresis function 136 (L) is decrease the value of $a_0(n+1)$, making $a_0(n+1)$ closer to −1 in value. The absolute value of $a_0(n+1)$ is clipped to 1 to ensure that the filter coefficient $a_0(n+1)$ remains inside the range −1 to +1.

In order to make the digital hammer filter 102 implementable using digital filter computation techniques, the spring constant function 140 (X) generates a felt stiffness coefficient $a_0(n+1)$ for time period n+1, and a unit time delay element 142 stores each felt stiffness coefficient value $a_0(n+1)$ so as to output the felt stiffness coefficient value $a_0(n)$ for the current time period, n.

The current felt stiffness coefficient value $a_0(n)$, also herein called the time varying hammer filter coefficient, is used by the hammer filter function 124 (H), the hammer impulse input function 128 (G), the felt compression function 134 (X), and the hammer velocity wave impedance function 117 (R) to compute their respective output values during the current time period, n.

Operation of the Music Synthesizer

Referring to FIG. 2, the operation of music synthesizer 100 is controlled by a controller 130, typically a microprocessor such as those found in Yamaha synthesizers or the microprocessors found in desktop computers. The controller 130 receives commands from a user interface 150 that typically includes command input devices such as a set of function buttons, vibrato and other control wheels, a keyboard for specifying tones or notes to be generated, as well as output devices such as an LCD display and other visual feedback output devises that confirm user commands and inform the user of the state of the synthesizer. In most implementations, the user interface 150 can be coupled to a computer so as to receive MIDI commands, pitch values and the like from a computer.

The controller 130 includes a resonator setup program that generates control parameters for the main resonator, such as delay line lengths for the resonator's delay lines 152, scattering junction and termination junction parameters that determine the resonating properties of the resonator 105, and the gain constant G1 of the resonator's output amplifier 154. Similarly, a hammer setup program sets the control parameters, such as the spring constant conversion table, and the values of the mass and time scale factors α, used by the functions in the hammer filter 102. Music synthesis by the system 100 is performed under the control of resonator and hammer execution programs executed by the controller 130. The signals output by the resonator are converted from digital form to an analog voltage by a digital to analog converter 156, are amplified by the output amplifier 154 and then transmitted to one or more speakers 158 so as to generate audible sounds.

Digital Hammer with Mesh Connected Resonator Network

Figure 8:
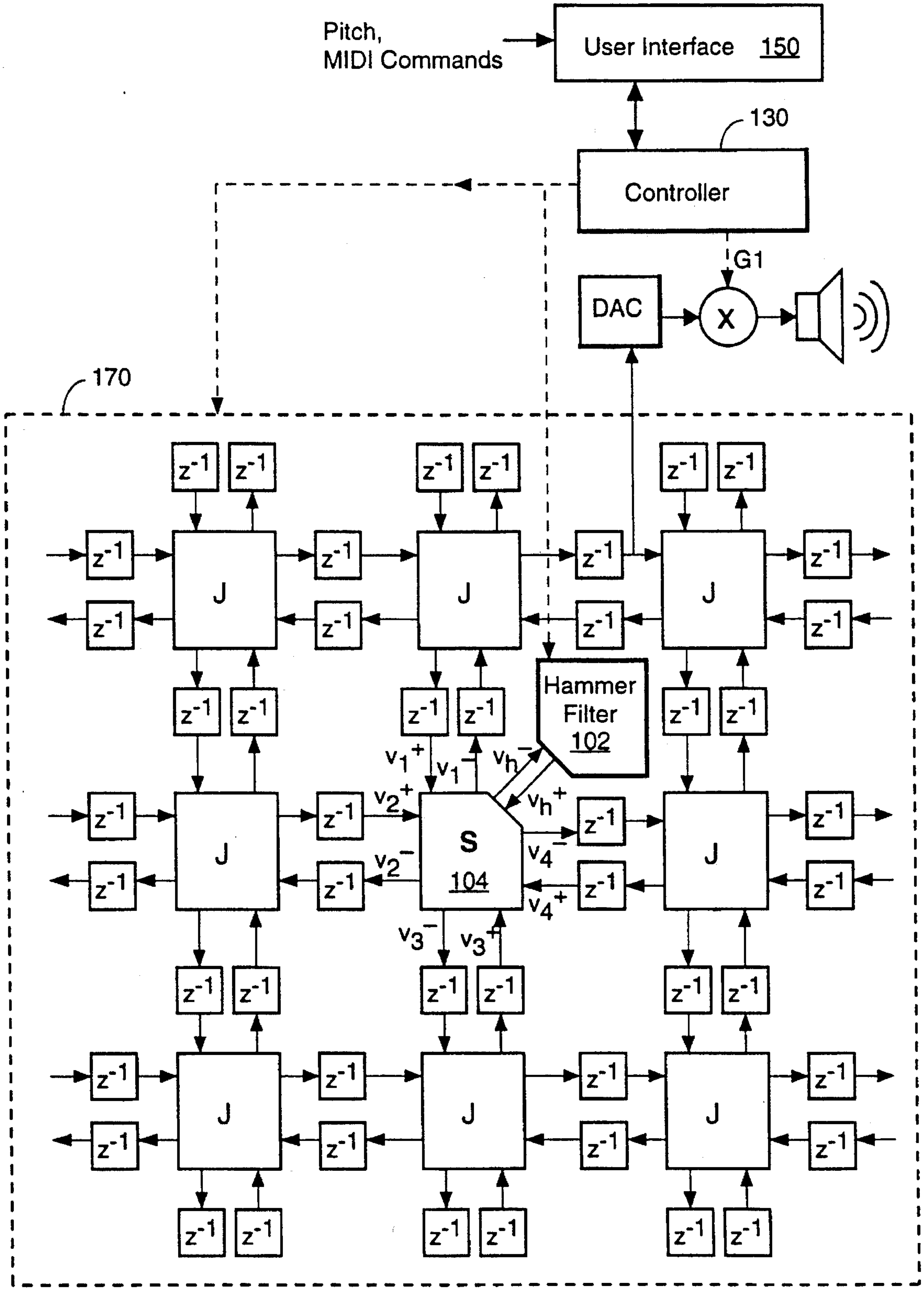
FIG. 8 is a block diagram of a music synthesizer having a two dimensional digital waveguide resonator mesh and a digital waveguide hammer filter in accordance with the present invention.

Referring to FIG. 8, the operation of the digital hammer when used with a resonator 170 having a two-dimensional mesh of digital waveguides is largely the same described above. However, since the digital hammer's scattering junction 104 now receives four waveforms resonator 170 and outputs four waveforms back into the resonator 170, the operation of the scattering junction 104 must be changed to take the additional resonator waveforms into account. In the preferred embodiment, the operation of the digital hammer scattering junction 104 when used with a resonator having a two-dimensional mesh of digital waveguides is defined as follows:

$$\begin{cases} v_1^-(n) = v_j(n) - v_1^+(n) \\ v_2^-(n) = v_j(n) - v_2^+(n) \\ v_3^-(n) = v_j(n) - v_3^+(n) \\ v_4^-(n) = v_j(n) - v_4^+(n) \\ v_5^-(n) = v_j(n) - v_5^+(n) \end{cases} \quad (15)$$

where $$v_j(n) = \frac{2R_0[v_1^+(n) + v_2^+(n) + v_3^+(n) + v_4^+(n)] + 2R_h(n)v_h^+(n)}{4R_o + R_h(n)} \quad (16)$$

More generally, each of the digital waveguides coupled to the digital hammer's scattering junction could be given a distinct wave impedance ($R_1$, $R_2$, $R_3$, $R_4$), in order to simulate a system in which waves propagate unevenly over a two dimensional membrane (e.g., in a simulated cymbal having the digital waveguides coupled in a spiral pattern and radial couplings that have different wave impedances than the spiral couplings) in which case the junction velocity equation 16 above would have to be adjusted accordingly.

The inventors have found the digital hammer filter of the present invention to be a very convenient and computationally efficient mechanism for introducing realistic excitation signals into two dimensional networks of digital waveguides, enabling the efficient synthesis of realistic drum sounds and the like.

Even more generally, the digital hammer filter 102 of the present invention can be used with a resonator 170 having an N-dimensional mesh of digital waveguides, with the scattering junction equations being adjusted in order to properly represent the coupling the number and wave impedances of the digital waveguides coupled to the digital hammer filter. In such applications of the digital hammer filter $v_j(n)$ is defined as $$v_j(n) = \frac{2R_0 \sum_{i=1}^{N} (\text{digital resonator waveforms: } v_i^+) + 2R_h(n)v_h^+(n)}{N \times R_0 + R_h(n)}$$

where N represents the number of digital resonator waveforms received by the scattering junction.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A musical sound synthesizer that simulates interaction of a hammer having a compressible striking surface with a resonating medium, comprising:

a digital waveguide resonator that simulates operation of said resonating medium and generates digital resonator waveforms representing signals propagating in said digital waveguide resonator; and a hammer filter that simulates said hammer striking said resonating medium by generating first and second hammer waveforms; said hammer filter including a scattering junction that couples said hammer filter to said digital waveguide resonator;

said hammer filter including:

a compression function that generates from said first and second hammer waveforms a compression value corresponding to compression of said simulated hammer;

a stiffness function that generates a time varying stiffness coefficient as a function of said compression value;

a excitation signal function that generates a hammer excitation signal as a function of hammer strike impulses; and a hammer function that generates said first hammer waveform as a function of said compression value, said hammer excitation signal and said second hammer waveform;

wherein said scattering junction transmits said digital resonator waveforms received from said digital waveguide resonator, unchanged by said first hammer waveform, back into said digital waveguide resonator when said compression value corresponds to said hammer not being compressed, and otherwise transmits into said digital waveguide resonator a first time varying portion of said first digital resonator waveform combined with a second time varying portion of said digital resonator waveforms, wherein said first and second time varying portions of said first digital waveguide waveform and said digital resonator waveforms, respectively, are functions of said compression value.

2. The musical sound synthesizer of claim 1, said stiffness function including a hysteresis function that determines said compression value's rate of change, generates a hysteresis factor proportional to said rate of change, and adjusts said time varying stiffness coefficient in accordance with said hysteresis factor so that said time varying stiffness coefficient for any given compression value represents a greater stiffness while said simulated hammer's compression is increasing than while said simulated hammer's compression is decreasing.

3. The musical sound synthesizer of claim 1, said scattering junction including a first set of ports for transmitting at least a portion of said digital resonator waveforms into said hammer filter and a second set of ports for transmitting a time varying portion of first hammer waveform to said digital waveguide resonator;

said scattering junction generating said second hammer waveform by combining a first time varying portion of said digital resonator waveforms with a first time varying portion of said hammer filter waveform in accordance with the formula:

$$v_h^-(n)=v_j(n)-v_h^+(n)$$

where $v_h^-(n)$ represents said second hammer filter waveform, $v_h^+(n)$ represents said first hammer filter waveform, and $v_j(n)$ is defined as $$v_j(n) = \frac{2R_0 \sum_{i=1}^{N} (\text{said digital resonator waveforms}) + 2R_h(n)v_h^+(n)}{N \times R_0 + R_h(n)}$$

where N represents how many of said digital resonator waveforms said digital waveguide resonator generates, $R_0$ represents a wave impedance associated with said digital resonator waveforms, and $R_h(n)$ represents a time varying wave impedance associated with said second hammer waveform, and $R_h(n)$ is defined as:

$$R_h(n) = \frac{(m\alpha)(1 + a_0(n))}{2}$$

where m represents said simulated hammer's mass, $\alpha$ is a constant, and $a_0(n)$ represents said time varying stiffness coefficient.

4. A musical sound synthesizer that simulates interaction of a hammer having a compressible striking surface with a resonating medium, comprising:

a digital waveguide resonator that simulates operation of said resonating medium and generates first digital resonator waveforms representing acoustic frequency signals propagating in said digital waveguide resonator;

a hammer filter coupled to said digital waveguide resonator by a scattering junction for simulating said hammer striking said resonating medium and for generating a first hammer filter waveform;

said scattering junction including a first port for receiving said first digital resonator waveforms generated by said digital waveguide resonator; a second port for receiving said first hammer filter waveform; a third port for transmitting into said hammer filter a second hammer filter waveform, wherein said scattering junction generates said second hammer filter waveform by combining a first time varying portion of said first digital resonator waveforms received from said digital waveguide resonator with a first time varying portion of said first hammer filter waveform; and a fourth port for transmitting waveforms into said digital waveguide resonator waveforms, wherein said scattering junction generates said transmitted waveforms by combining a second time varying portion of said first digital resonator waveforms received from said digital waveguide resonator with a second time varying portion of said first hammer filter waveform;

said hammer filter including a compression function that generates from said first and second hammer waveforms a compression value corresponding to compression of said simulated hammer;

a stiffness function that generates a time varying stiffness coefficient as a function of said compression value; and a excitation signal function that generates a hammer excitation signal as a function of hammer strike impulses;

a hammer function that generates said first hammer filter waveform as a function of said compression value, said hammer excitation signal and said second hammer waveform;

wherein said scattering junction passes said first digital resonator waveforms received from said digital waveguide resonator unchanged to said fourth port when said compression value corresponds to said hammer not being compressed and otherwise transmits through said fourth port said second time varying portion of said first digital resonator waveforms received from said digital waveguide combined with said second time varying portion of said first hammer filter waveform, wherein said second time varying portions of said first digital waveguide waveforms and of said first hammer filter waveform are functions of said compression value.

5. The musical sound synthesizer of claim 4, said stiffness function including a hysteresis function that determines said compression value's rate of change, generates a hysteresis factor proportional to said rate of change, and adjusts said time varying stiffness coefficient in accordance with said hysteresis factor so that said time varying stiffness coefficient for any given compression value represents a greater stiffness while said simulated hammer's compression is increasing than while said simulated hammer's compression is decreasing.

6. A method of synthesizing sounds associated with interaction of a hammer having a compressible striking surface with a resonating medium, comprising:

providing a digital waveguide resonator that simulates operation of said resonating medium and generates digital resonator waveforms representing signals propagating in said digital waveguide resonator; and simulating said hammer striking said resonating medium by generating first and second hammer waveforms, including:

generating from said first and second hammer waveforms a compression value corresponding to compression of said simulated hammer;

generating a time varying stiffness coefficient as a function of said compression value;

generating a hammer excitation signal as a function of hammer strike impulses; and generating said first hammer waveform as a function of said compression value, said hammer excitation signal and said second hammer waveform;

transmitting said digital resonator waveforms received from said digital waveguide resonator, unchanged by said first hammer waveform, back into said digital waveguide resonator when said compression value corresponds to said hammer not being compressed, and otherwise transmitting into said digital waveguide resonator a first time varying portion of said first digital resonator waveform combined with a second time varying portion of said digital resonator waveforms, wherein said first and second time varying portions of said first digital waveguide waveform and said digital resonator waveforms, respectively, are functions of said compression value.

7. A method of synthesizing sounds as set forth in claim 6, wherein said step of generating a time varying stiffness coefficient including determining said compression value's rate of change, generating a hysteresis factor proportional to said rate of change, and adjusting said time varying stiffness coefficient in accordance with said hysteresis factor so that said time varying stiffness coefficient for any given compression value represents a greater stiffness while said simulated hammer's compression is increasing than while said simulated hammer's compression is decreasing.

8. The method of synthesizing sounds as set forth in claim 6, including generating said second hammer waveform by combining a first time varying portion of said digital resonator waveforms with a first time varying portion of said hammer filter waveform in accordance with the formula:

$$v_h^-(n)=v_j(n)-v_h^-(n)$$

where $v_h^-(n)$ represents said second hammer filter waveform, $v_h^+(n)$ represents said first hammer filter waveform, and $v_j(n)$ is defined as $$v_j(n) = \frac{2R_0\,\Sigma(\text{said digital resonator waveforms}) + 2R_h(n)v_h^+(n)}{N\times R_0 + R_h(n)}$$

where N represents how many of said digital resonator waveforms said digital waveguide resonator generates, $R_0$ represents a wave impedance associated with said digital resonator waveforms, and $R_h(n)$ represents a time varying wave impedance associated with said second hammer waveform, and $R_h(n)$ is defined as:

$$R_h(n) = \frac{(m\alpha)(1 + a_0(n))}{2}$$

where m represents said simulated hammer's mass, α is a constant, and $a_0(n)$ represents said time varying stiffness coefficient.

* * * * *